(12) United States Patent
Royak et al.

(10) Patent No.: US 8,081,047 B2
(45) Date of Patent: Dec. 20, 2011

(54) MULTI-BAND CIRCUIT WITH FIRST AND SECOND SIGNAL BRANCHES

(75) Inventors: Sergiy Royak, Munich (DE); Georgiy Sevskiy, Munich (DE); Denys Orlenko, Munich (DE); Patric Heide, Vaterstetten (DE)

(73) Assignee: Epcos AG, Munich (DE)

( * ) Notice: Subject to any disclaimer, the term of this patent is extended or adjusted under 35 U.S.C. 154(b) by 337 days.

(21) Appl. No.: 12/088,002

(22) PCT Filed: Sep. 28, 2006

(86) PCT No.: PCT/DE2006/001721
§ 371 (c)(1),
(2), (4) Date: May 15, 2008

(87) PCT Pub. No.: WO2007/036221
PCT Pub. Date: Apr. 5, 2007

(65) Prior Publication Data
US 2008/0204163 A1    Aug. 28, 2008

(30) Foreign Application Priority Data
Sep. 28, 2005 (DE) .................. 10 2005 046 452

(51) Int. Cl.
*H03H 7/46* (2006.01)
*H05K 1/02* (2006.01)

(52) U.S. Cl. ........................................ 333/132; 333/129

(58) Field of Classification Search .............. 333/5, 100, 333/124–134
See application file for complete search history.

(56) References Cited

U.S. PATENT DOCUMENTS

| 4,980,660 | A | * | 12/1990 | Nakamura et al. ............. 333/101 |
| 5,880,649 | A | | 3/1999 | Tai et al. |
| 5,969,582 | A | * | 10/1999 | Boesch et al. ................. 333/129 |
| 6,445,262 | B1 | | 9/2002 | Tanaka et al. |
| 2003/0058063 | A1 | | 3/2003 | Sheen |

FOREIGN PATENT DOCUMENTS

| EP | 0 793 289 | 9/1997 |
| EP | 089 449 | 11/2006 |
| JP | 10-200442 | 7/1998 |
| JP | 2001-044885 | 2/2001 |
| JP | 2001-185902 | 7/2001 |
| JP | 2005-136896 | 5/2005 |

OTHER PUBLICATIONS

Wing-Yan Leung, et al "Multilayer LTCC Bandpass Filter Design with Enhanced Stopband Characteristics" IEEE Microwave and Wireless Components Letter, vol. 12, No. 7, Jul. 2002.

(Continued)

*Primary Examiner* — Robert Pascal
*Assistant Examiner* — Kimberly E Glenn
(74) *Attorney, Agent, or Firm* — Fish & Richardson P.C.

(57) ABSTRACT

A multiband circuit includes a signal path comprising a first signal branch that includes a first circuit that is transmissive in a first frequency band and a second signal branch that includes a second circuit that is transmissive in a second frequency band. The first and second signal branches are combined on an antenna side into a common path.

20 Claims, 10 Drawing Sheets

OTHER PUBLICATIONS

Hideyuki Miyake et al. "A New Circuit Configuration to Obtain Large Attenuation with a Coupled-Resonator band Elimination Filter Using Laminated LTCC" 2000 IEEE MTT-S Digest, 2000 pp. 195-198.

Denys Orlenko et al "Novel High-Rejection LTCC Diplexers for Dual-band WLAN Applications" 2005 IEEE MTT-S International Microwave Symposium Conference, Jun. 2005.

Albert Sutono et al "Design of Miniature Multilayer On-Package Integrated Image-Reject Filters" IEEE Transactions on Microwave Theory and Techniques, vol. 51, No. 1, Jan. 2003.

International Search Report for PCT/DE2006/001721.

Written Opinion for PCT/DE2006/001721.

English translation of Written Opinion for PCT/DE2006/001721.

Notification of Reasons for Refusal (type I office action), in JP Pat. Appl. No. 2008-532594, mailed Apr. 28, 2011, 2 pages.

* cited by examiner

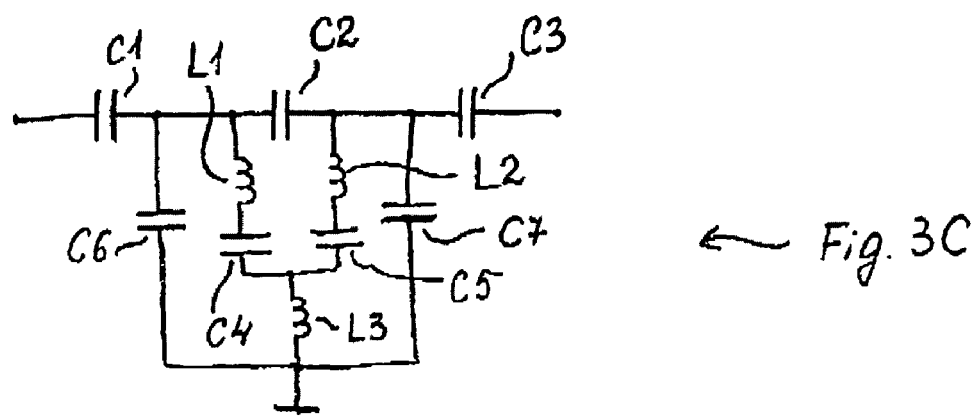
← Fig. 3C
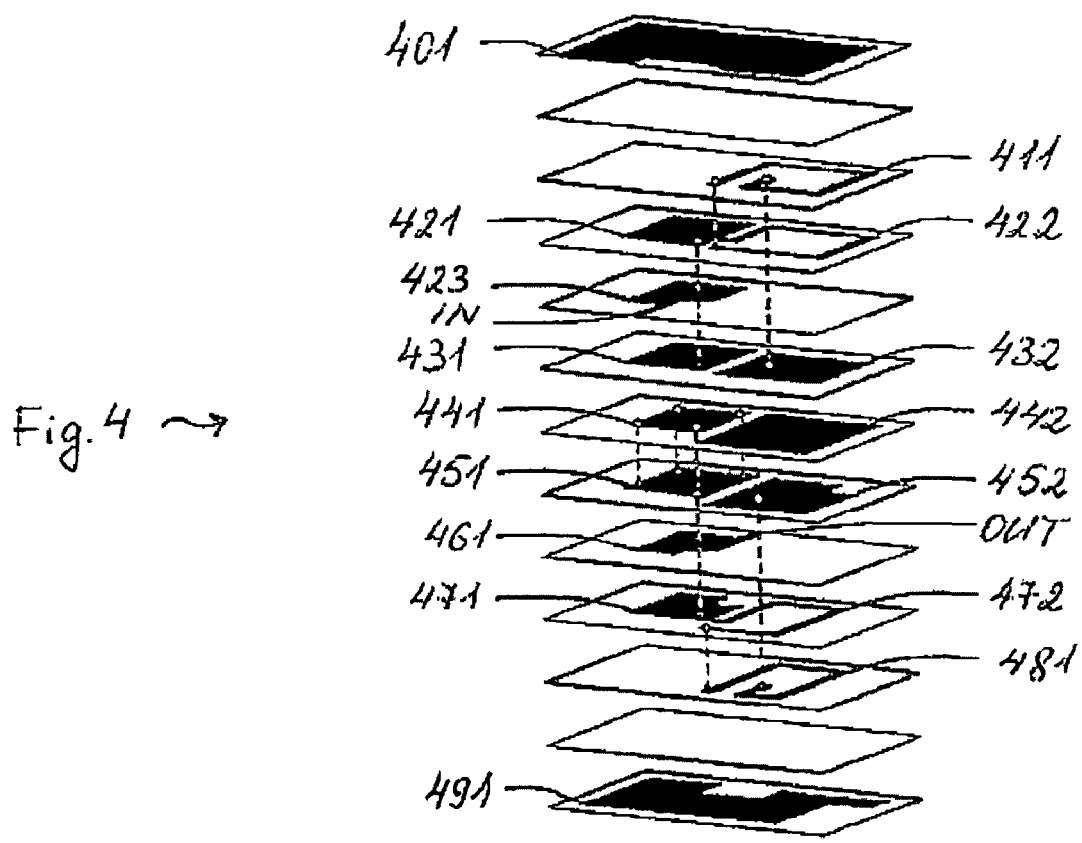
Fig. 4 →

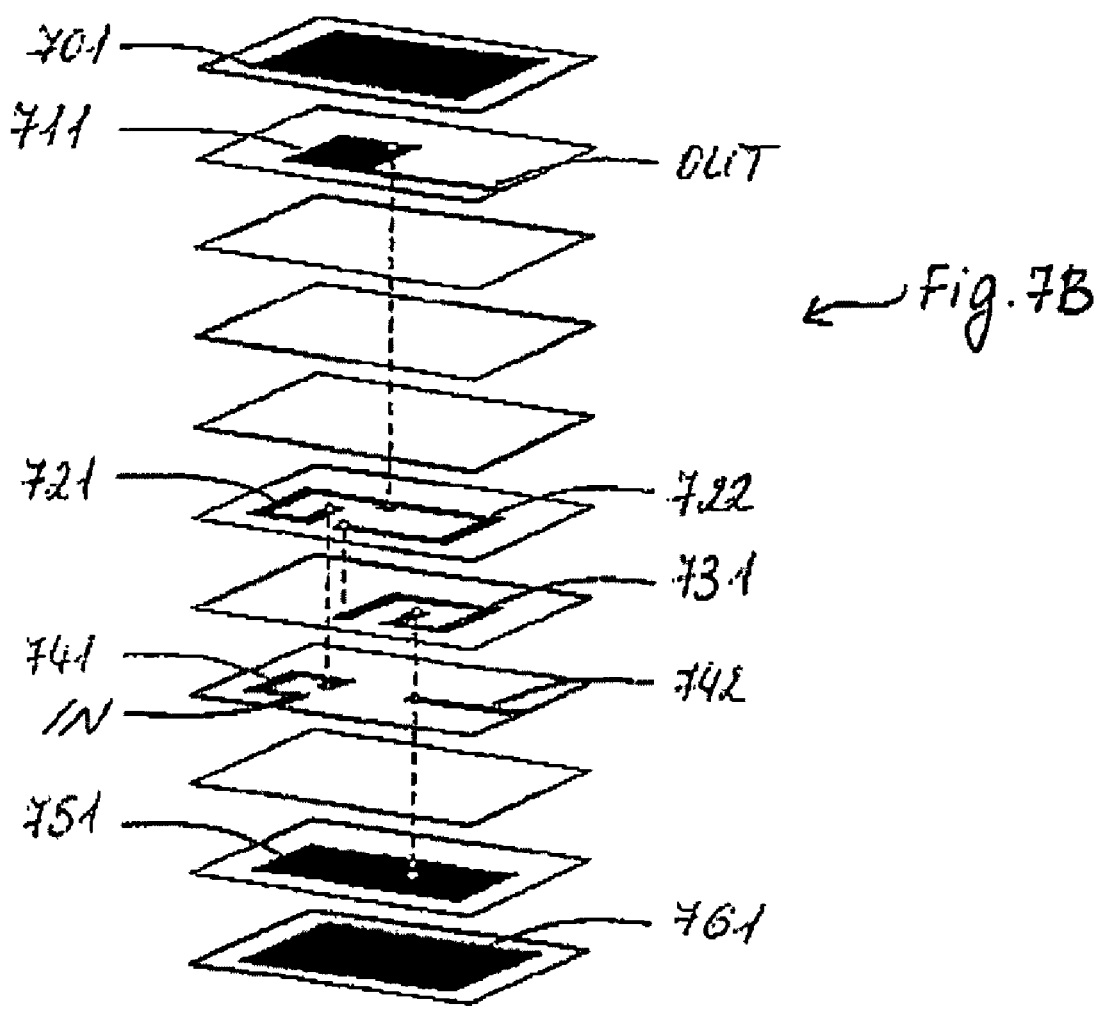

Key: 1 Frequency

MULTI-BAND CIRCUIT WITH FIRST AND SECOND SIGNAL BRANCHES

CROSS REFERENCE TO RELATED APPLICATIONS

Pursuant to 35 USC §120, this application claims the benefit of PCT/DE2006/001721 filed Sep. 28, 2006 which claims the benefit of German Patent Application No. 102005046452.1 filed Sep. 28, 2005. Each Of these applications is incorporated by reference in its entirety.

BACKGROUND

A circuit with a diplexer suitable for the separation of signals from two different frequency bands is known from U.S. Pat. No. 5,880,649.

SUMMARY

One problem to be solved is to specify a multiband circuit that can be realized economically and in a space-saving component.

According to a first preferred embodiment, a multiband circuit is specified, with a signal path having on the antenna side a first and a second signal branch combined into a common path. The first signal branch comprises a first circuit that is transmissive in a first frequency band, and the second signal branch comprises a second circuit that is transmissive in a second frequency band and shunts the HF signals at a blocking frequency—preferably a notch frequency—to ground. Due to the second circuit, a short circuit to ground is produced for the antenna-side input signal of the two branches at a frequency assigned to a stopband, whereby the near-band rejection of the first signal branch can be significantly improved.

A circuit that functions as a harmonic absorber for the first branch and produces a notch in the transmission characteristics of this signal branch is thus not in a shunt arm to ground connected to this signal branch, but is arranged in the second signal branch. A flank in the transfer function of the first circuit or the first path can be produced by this notch, or a possibly already existing flank can be made steeper.

It is also possible for the first circuit to shunt the HF signals to ground at another blocking frequency—preferably a notch frequency—and thus to short-circuit the antenna-side input of the first and second signal branch at the additional blocking frequency. A flank in the transfer function of the second circuit or the second path can be produced by this notch, or a possibly already existing flank can be made steeper.

In one variant, the first circuit comprises a first matching network (first low-pass filter) arranged on the antenna side, and the second circuit comprises a second matching network (second low-pass filter) arranged on the antenna side, which are directly conductively connected to one another and to the common path.

According to a second preferred embodiment, a multiband signal circuit is specified, with signal branches combined into a common path on the antenna side, wherein a first signal branch is transmissive in a first frequency band and a second signal branch is transmissive in a second frequency band. A first matching network (first low-pass filter) is arranged in the first branch, and a second matching network (second low-pass filter) is arranged in the second branch, which filters are conductively connected directly (on the antenna side) to one another and to the common path. In the second signal path, a second circuit comprising the second low-pass filter circuit is arranged, which shunts the HF signals to ground at a blocking frequency, and thus produces an HF short circuit to ground at this blocking frequency at the antenna-side input of the first (and the second) signal branch.

In the first signal branch, it is also possible to arrange a circuit that comprises the first matching network or low-pass filter and shunts the HF signals at an additional blocking frequency to ground, and thus produces an HF short circuit to ground for this frequency at the input of the second signal branch.

Advantageous variants of the multiband circuit according to the preferred first and second embodiments will be explained below.

The transmission characteristic of the first and the second signal branch or of the first and second circuits is measured between the output of the first or second circuit and the connection node of this branch to the common path.

The signal branches are connected on the input side to a common path of the signal path, and on the output side to a respective signal terminal of an electrical gate.

The signal path can be a transmit path or a receive path; its two signal branches can be transmit branches or receive branches, respectively. The signal path can also be a transceiver path, in which case its signal branches represent a transmit branch and a receive branch.

The multiband circuit preferably has at least two signal paths, e.g., a receive path and a transmit path. The latter can preferably be connected by means of an antenna switch to an antenna path leading to an antenna. The second signal path is preferably constructed similarly to the first, i.e., with two signal branches.

The first circuit can comprise a third filter—a low-pass filter, a bandpass filter or an additional high-pass filter—that is connected downstream of the first matching network or low-pass filter of the circuit, as viewed from the antenna. The second circuit can comprise a fourth filter—e.g., a low-pass filter or a bandpass filter—that is connected downstream of the second matching network or low-pass filter, as viewed from the antenna.

The subcircuit consisting of the first and second matching networks that are arranged at the branch of the signal path replaces a diplexer, usually used for band separation, that consists of a low-pass filter arranged in a first signal branch and a high-pass filter arranged in a second signal branch.

At least one shunt arm can be connected to ground at the electrical node at which the first and second signal branches are connected. A capacitor is preferably arranged in this shunt arm. This shunt arm can be associated both with the matching network/LPF arranged in the first signal branch and with the matching network/LPF arranged in a second signal branch. The matching network can be, for instance, a π element with an inductor or line section in the series branch and capacitors in the shunt arms. The matching network can also be formed by a line section, however.

In an advantageous variant, the matching network arranged in the second signal path and the fourth filter arranged downstream of it that functions outside the second frequency band, and in particular in the first band, as a capacitor to ground, form a harmonic absorber that has a resonant frequency at the blocking frequency of the second circuit and shunts the HF signals to ground at this notch frequency.

The second frequency band preferably lies at least one octave above the first frequency band.

The blocking frequency of the second circuit can lie between the first and the second frequency bands. It can also lie beneath the first frequency band situated at lower frequencies, or above the higher second frequency band. This also applies to the blocking frequency of the first circuit.

The first circuit can comprise a high-pass filter as a third filter, which can be connected downstream of the antenna-side matching network, as viewed from the antenna. The blocking frequency of the second circuit is preferably arranged in the passband of this high-pass filter. Alternatively, the first circuit can comprise a low-pass filter as a third filter, which is connected downstream of the antenna-side matching network. The blocking frequency of the second circuit is preferably arranged in the passband of this low-pass filter.

In one variant the first circuit can comprise a bandpass filter as a third filter, which can be inserted downstream of the antenna-side matching network, as viewed from the antenna. The blocking frequency of the second circuit is then preferably below or above the passband of this bandpass filter.

The first and the second circuits preferably have concentrated LC elements, optionally line sections as well. However, the first and the second circuits can in principle also be realized as lines, in particular, transformation lines.

The third and the fourth filters are preferably distinguished by a relatively low insertion loss, e.g., at most 1.5 dB, in their passband. The third filter can have a relatively low suppression of, e.g., less than 20 dB in a stopband. This on its own may not be sufficient to suppress the first or second harmonic of the signal to be transmitted in the first frequency band. By virtue of the second circuit, the suppression in this stopband can be improved in the transmission characteristic of the first signal branch by at least 15 dB, for instance.

The specified multiband circuit can be integrated into an electrical component comprising a multilayer substrate that is compact and preferably suitable for surface mounting. The multilayer substrate comprises metallization layers and dielectric layers arranged between them, e.g., ceramic layers. In particular, the concentrated LC elements of the multiband circuit can be realized in the substrate as conductive traces and conductive surfaces.

It is advantageous if the relative dielectric constant $\epsilon_r$ of the dielectric layers is relatively low, for example, less than 15, and in one variant $\epsilon_r \leq 10$.

The multiband circuit will be explained below on the basis of schematic figures not drawn to scale.

DESCRIPTION OF THE DRAWINGS

FIG. 3C, the equivalent circuit diagram of the high-pass filter arranged in the first circuit of the transmit path;

FIG. 4, a multilayer component with the integrated high-pass filter according to FIG. 3A, which is arranged in the first signal branch of the transmit path;

FIG. 7B, a multilayer component with the integrated matching networks according to FIG. 7A, which are arranged in the signal branches of the receive path;

DETAILED DESCRIPTION

Figure 1:
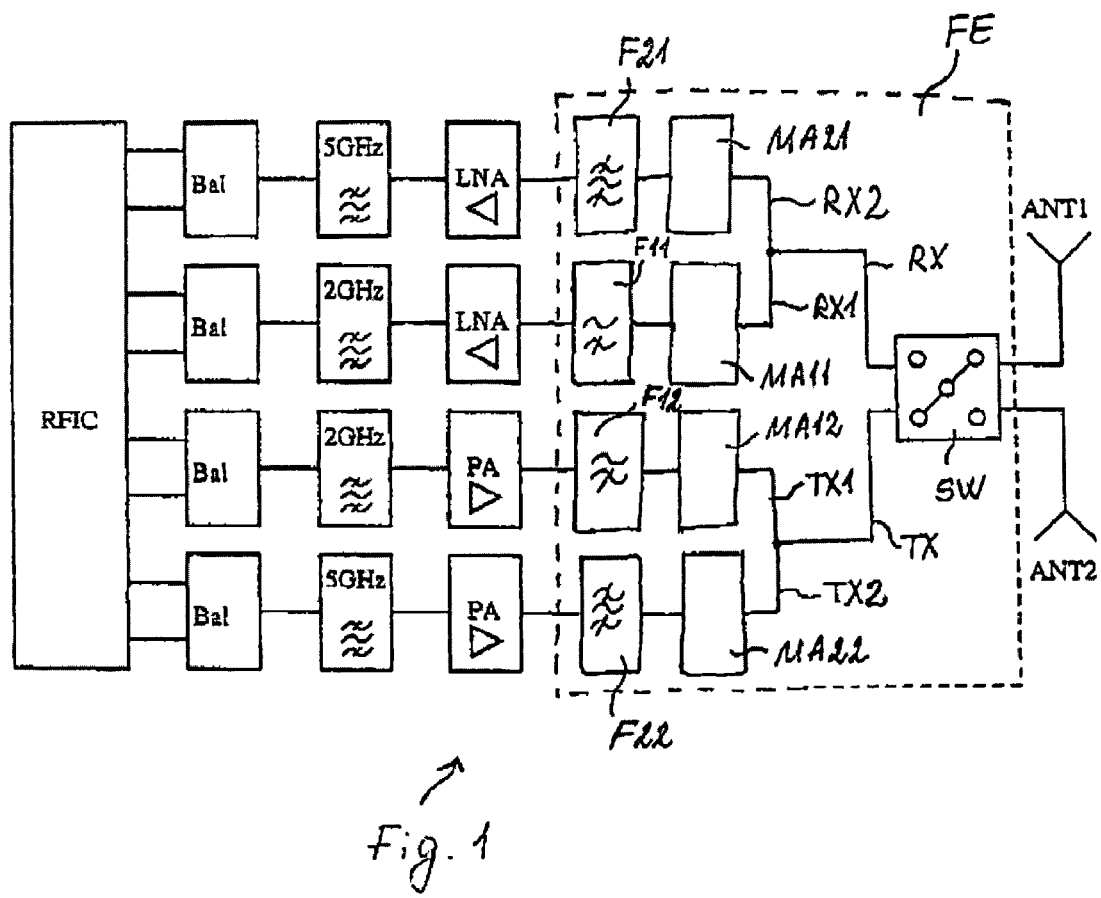
FIG. 1 shows the equivalent circuit diagram of a WLAN circuit comprising the front-end circuit with the specified multiband circuit, FIG. 2, a front-end circuit with the multiband circuit that comprises a first circuit arranged in the first signal branch and a second circuit arranged in the second signal branch, wherein the first and second circuits are each realized from LC elements.

FIG. 1 shows the equivalent circuit diagram of a WLAN circuit. The WLAN circuit comprises a front-end circuit FE that separates the signals transmitted in different frequency bands as well as the transmit and receive signals of one band. The data transmission (transmitting and receiving HF signals) in at least two frequency bands is accomplished by means of antennas ANT1 and ANT2, which are alternately connected via antenna switch SW to the TX signal path (transmit path) and the RX signal path (receive path).

Transmit path TX branches into two signal branches: a first signal branch TX1 and a second signal branch TX2. Receive branch RX likewise branches into two signal branches: a first signal branch RX1 and a second signal branch RX2.

In the two first signal branches RX1, TX1 the signals of first frequency band FB1 are transmitted, and the signals of the second frequency band FB2 are transmitted in the two second signal branches RX2, TX2. The transmit signals of the first frequency band (with a center frequency of roughly 2.5 GHz) are transmitted in the first signal path TX1, and the receive signals of this band are received in first signal branch RX1, respectively. The transmit signals of the second frequency band (with a center frequency of approximately 5 GHz) are transmitted in a second signal path TX2 and the receive signals of this band are received in second signal branch RX2.

A first circuit comprising a matching network, here MA11 or MA12, and a third filter F11 or F12, respectively, is arranged in the respective first signal branch RX1, TX1. A second circuit comprising a matching network, here MA21 or MA22, and a fourth filter F21 or F22, respectively, is arranged in the respective first signal branch RX2, TX2.

Matching network MA11, MA12 arranged in the first circuit blocks in a frequency range above first frequency band FB1. Matching network MA21, MA22 arranged in the second circuit blocks in a frequency range above second frequency band FB2.

Figure 9A:
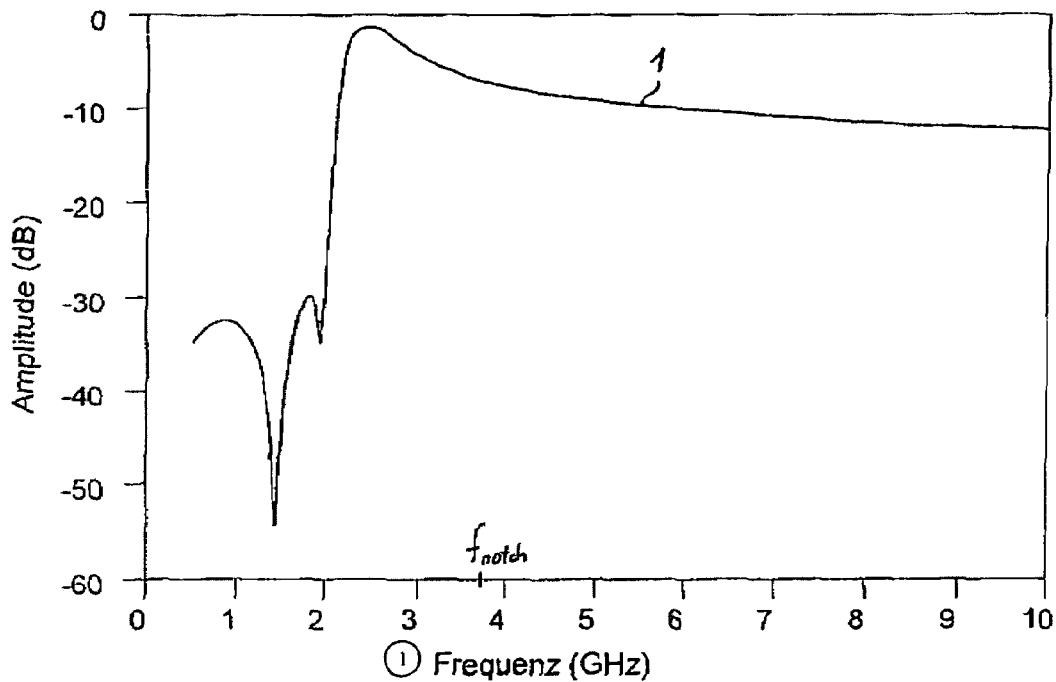
FIG. 9A, the transfer function of the high-pass filter arranged in the first signal branch of the receive path or the transmit path.
Figure 9B:
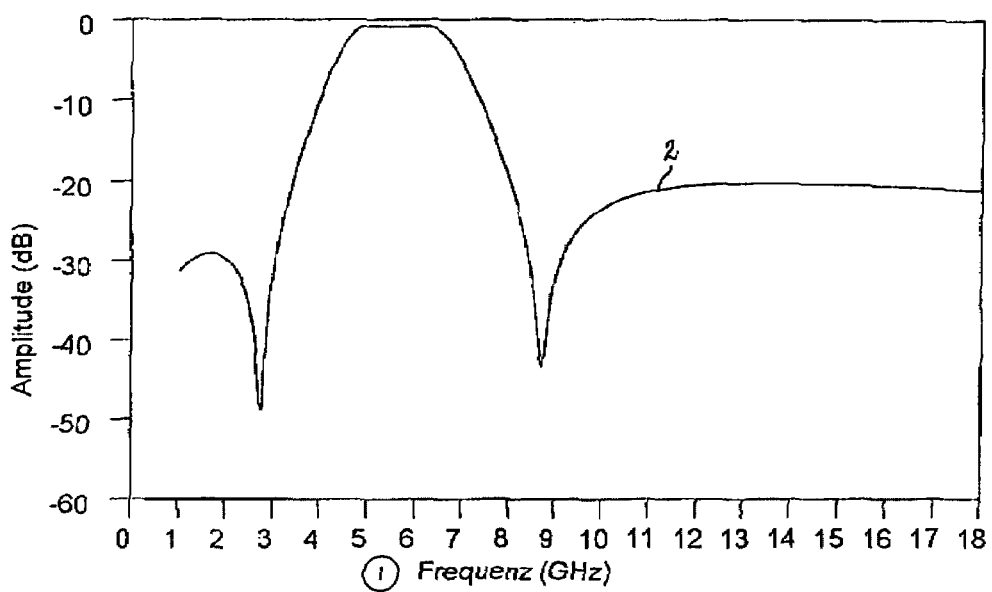
FIG. 9B, the transfer function of the bandpass filter arranged in the second signal branch of the receive path or the transmit path.
Figure 9C:
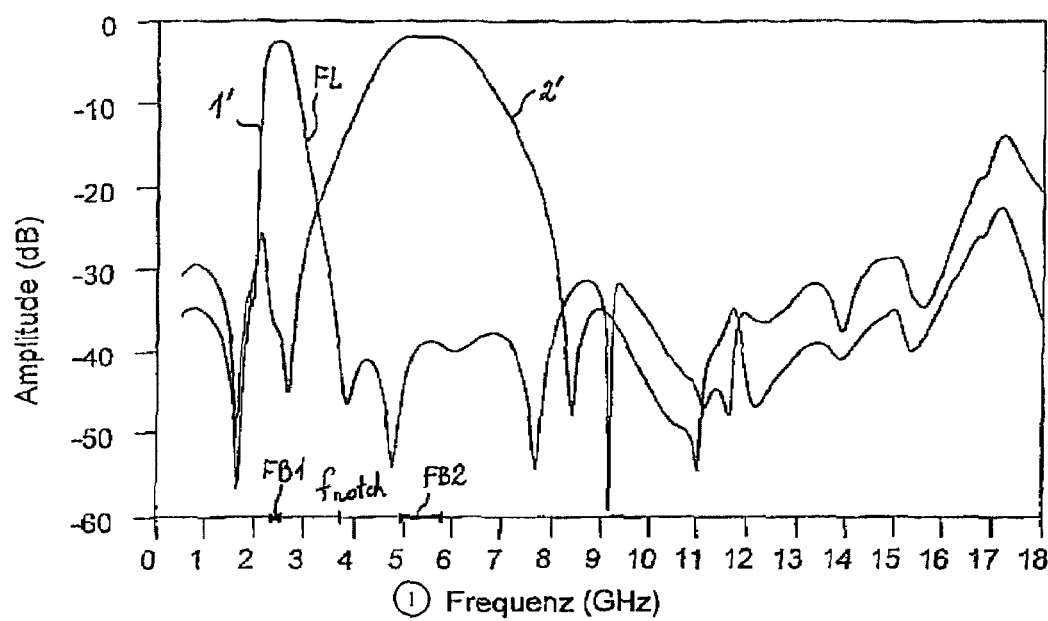
FIG. 9C, the transfer function of the first circuit and the second circuit.

The transmission-characteristic curves of the first and second circuits are shown in FIG. 9C. The typical transmission-characteristic curve of third filters F11, F12 arranged in the first signal branches is shown in FIG. 9A, and the typical transmission-characteristic curve of fourth filters F21, F22 is shown in FIG. 9B.

Figure 2:
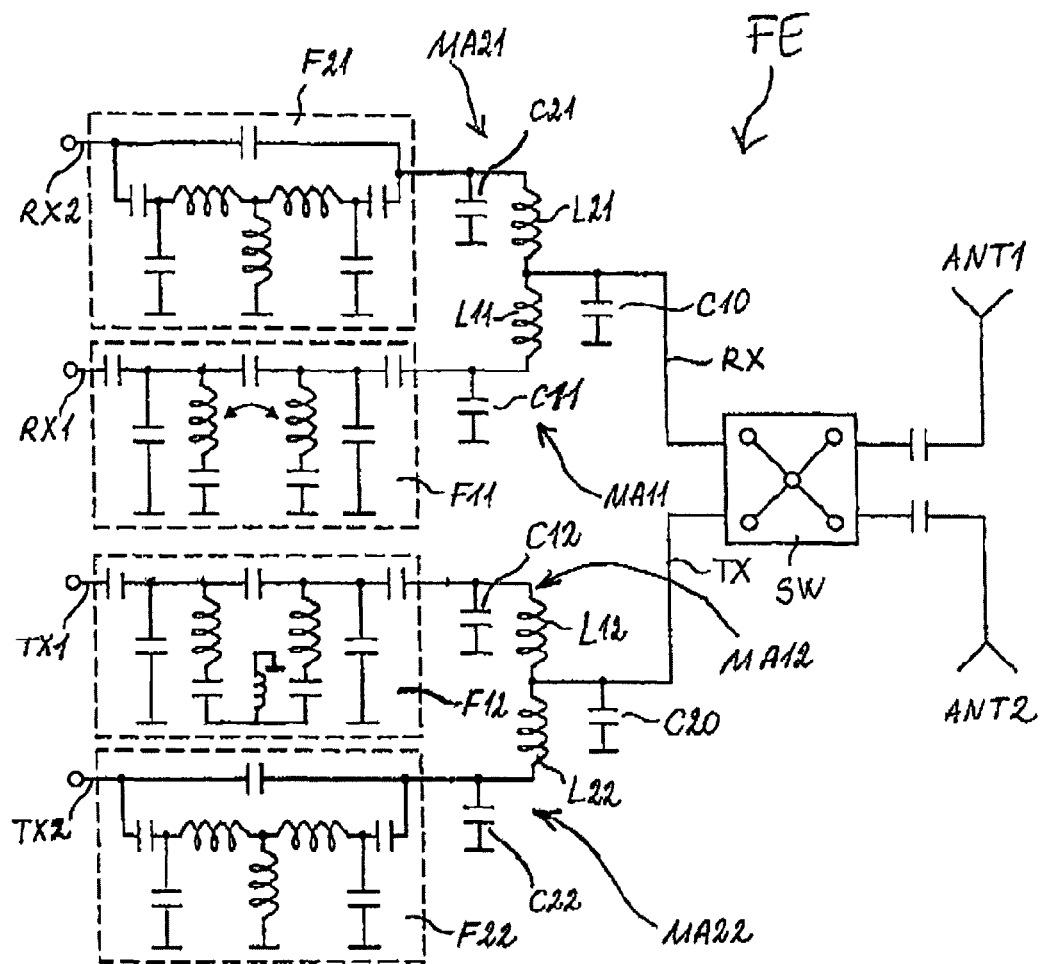

Third filters F11, F12 are high-pass filters in the variants shown in FIGS. 1 and 2, and fourth filters F21, F22 are bandpass filters.

Antenna switch SW is preferably a "diversity switch" or a DPDT switch (double-pole double-throw switch). It can contain field-effect transistors based, for example, on GaAs.

Besides the front-end circuit, a low-noise amplifier LNA, an additional filter—here a bandpass filter—and a balun Bal are arranged in the respective signal paths RX1, RX2 of receive path RX. Besides the front-end circuit, a power amplifier PA, an additional filter—a bandpass filter here—and a balun Bal are arranged in the respective signal paths TX1, TX2 of transmit path TX.

The baluns Bal ensure that the unbalanced paths RX1, RX2, TX1, TX2 are balanced at the interfaces with WLAN IC RFIC.

All filters, matching networks and baluns shown in FIG. 1 can comprise concentrated LC elements, preferably constructed as conductive trace sections and conductive surfaces. They can also have at least one discrete inductor or capacitor. At least some of the filters, particularly the bandpass filters, can be filter chips.

It is advantageous to realize front-end circuit FE in a compact component preferably suitable for SMD mounting. It is also possible to integrate the amplifiers LNA, PA, the additional filters and the baluns of the circuit shown in FIG. 1 into the compact component. The passive components, such as the LC elements, of this circuit are particularly suitable for integration into the substrate, which serves as a carrier for chips in one advantageous variant. These chips are understood to mean specifically: the semiconductor chips such as antenna switch SW and amplifiers LNA, PA or the filter chips.

Inductors and capacitors available as discrete components or chips can additionally be arranged on the substrate. For instance, these capacitors can be capacitors for DC decoupling in the antenna path, which are seen in FIG. 2.

Baluns are preferably realized in the substrate, for example, as LC elements. However, they can also be chips that can be mounted on the substrate. All chips can be bare dies or packaged chips. The chips can be electrically connected to the substrate by means of bonding wires or bumps.

The electrical component can have LGA connectors. The components arranged on the substrate are preferably encapsulated by a molding compound and thus are protected from environmental influences.

The component preferably has a transmit section and a receive section, between which a number of plated through-holes are arranged in one variant. The plated through-holes are connected to ground and improve the isolation between the two sections. The plated through-holes can be connected to a chip arranged on the substrate, such as the antenna switch chip, and serve as a heatsink.

A front-end circuit realized from concentrated LC elements is shown in FIG. 2.

Figure 7A:
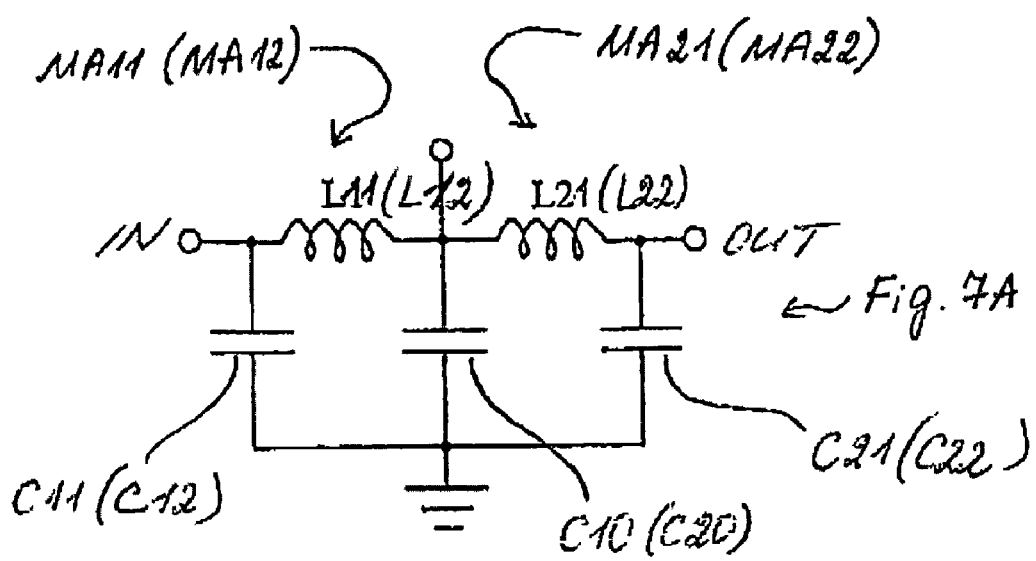
FIG. 7A, the equivalent circuit diagram of the matching networks arranged on the antenna side in the first and second signal branches of the transmit or receive path.

Each of matching networks MA11, MA12, MA21, MA22 comprises a π element that functions as a low-pass filter (see FIG. 7A as well). Matching network MA11 comprises capacitors C10 and C11 as well as inductor L11; matching network MA21 comprises capacitors C10 and C21 as well as inductor L21; matching network MA12 comprises capacitors C20 and C12 as well as inductor L12; matching network MA22 comprises capacitors C20 and C22 as well as inductor L22. Capacitors C10 and C20 arranged between common signal path RX or TX and ground are thus active in two matching networks MA11, MA21 and MA12, MA22, respectively.

The cut-off frequency of matching networks MA11, MA12, designed here as low-pass filters arranged in first signal branch RX1, TX1, is preferably selected such that the signals are attenuated above the first frequency band. The cut-off frequency of matching networks MA21, MA22, designed here as low-pass filters arranged in second signal branch RX2, TX2, is preferably selected such that the signals are attenuated above the second frequency band.

Figure 3A:
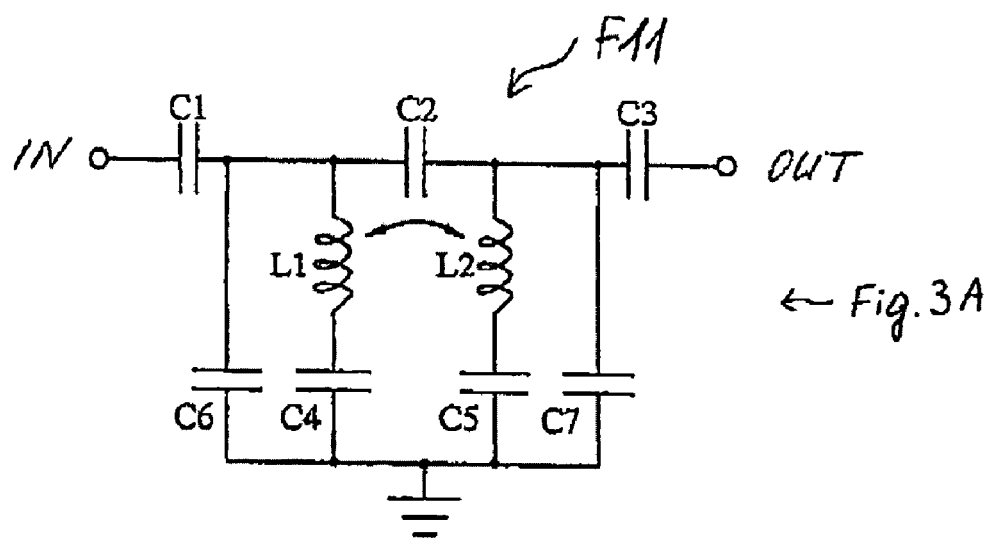
FIG. 3A, the equivalent circuit of the high-pass filter arranged in the first circuit of the receive path.

Third filter F11 designed for 2.5 GHz is a high-pass filter of higher order, which is transmissive in the first frequency band. Inductor L1 and capacitors C4, C6 form a first resonant circuit. Inductor L2 and capacitors C5, C7 form a second resonant circuit. Inductors L1, L2 arranged in different resonant circuits (see FIG. 3A) are magnetically coupled. Capacitors C1, C2, C3 are arranged in the signal path.

Filter F12 functions similarly to filter F ii, with the difference that the coupling between the inductors L1 and L2 is not magnetic, but is instead realized by a common inductor L3 (see FIG. 3C). The realization of the circuit can be seen in FIG. 4. Capacitors C4 and C5 are formed by conductive surfaces 432, 442 and 452. Surface 442 is connected by means of a plated through-hole to ground surface 491. The parasitic inductance of the plated through-hole and surface 442 together yield inductor L3 to ground, shown in FIG. 3C.

First signal paths TX1, RX1 have a first notch, which lies to the left of the passband in the transmission characteristic shown in FIG. 9A. An additional notch in the stopband of the signal path's transmission characteristic, which markedly improves the near-band rejection of the filter, is produced in the two filters F11 and F12 by a circuit comprising coupled inductors L1 and L2 and capacitor C2. The frequencies of the two notches can differ. They can also essentially coincide.

Figure 5A:
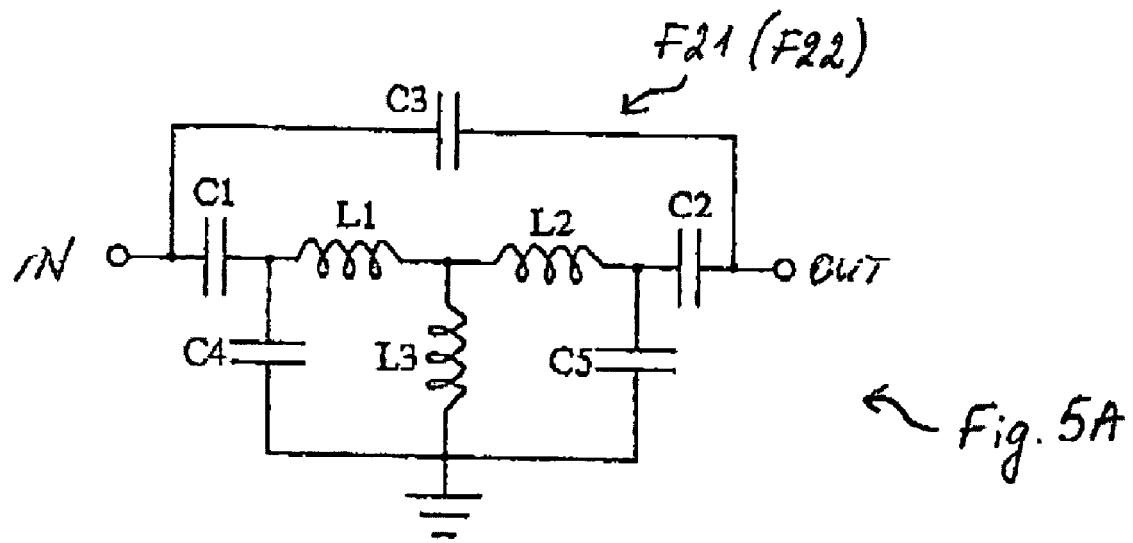
FIG. 5A, the equivalent circuit diagram of the bandpass filter arranged in the second circuit.

The filters F21, F22 designed for 5 GHz are bandpass filters that are transmissive in the second frequency band. The input and output of fourth filters F21 and F22 are capacitively coupled by means of capacitor C3. Inductors L1, L3 and capacitor C4 form a first parallel resonant circuit. Inductors L2, L3 and capacitor C5 form a second parallel resonant circuit. These parallel resonant circuits are electrically coupled via their common inductor L3 (see FIG. 5A). Inductor L3 is preferably small and in one variant can be realized by a very short line. Inductors L1, L2 and capacitors C1, C2 are arranged in the signal path.

In this filter, the signal is split into two sub-paths. One sub-path is formed by capacitor C3, and the other by the remainder of the circuit. The two sub-paths are again combined at the output. The signals of the two sub-paths have two different frequencies at the output—to the left and the right of the passband of the respective signal path—the same amplitudes and a phase shift of 180° so that, according to FIG. 9B, there are two notches in the transfer function of the filter.

The input of a sub-circuit F11, F12, F21, F22 or MA11/MA21, MA12/MA22 is labeled with the reference IN and the output is labeled with the reference OUT.

Fourth filter F21, F22 for second frequency band FB2 functions as a capacitor in first frequency band FB1. This capacitor and the π element upstream of fourth filter F21, F22, i.e., matching network MA21, MA22, together form a resonant circuit to ground, which has a low impedance at its resonant frequency, i.e., blocking frequency $f_{notch}$, and therefore shunts the HF signals at this frequency to ground. This implies that second circuit F21/MA21, F22/MA22 functions as a notch filter.

The π element can in principle be replaced by a line section or an inductor.

The effect of second circuit F21/MA21 or F22/MA22 is that a steep right flank FL (FIG. 9C) is created in the transfer function 1' of first circuit F11/MA11 or F12/MA12. The left flank of transfer function 1' is produced by the transfer function 1 of third filter F11 or F12 (cf FIG. 9A).

The transfer function 2', on the other hand, is not significantly influenced by first circuit F11/MA11 or F12/MA12.

Figure 3B:
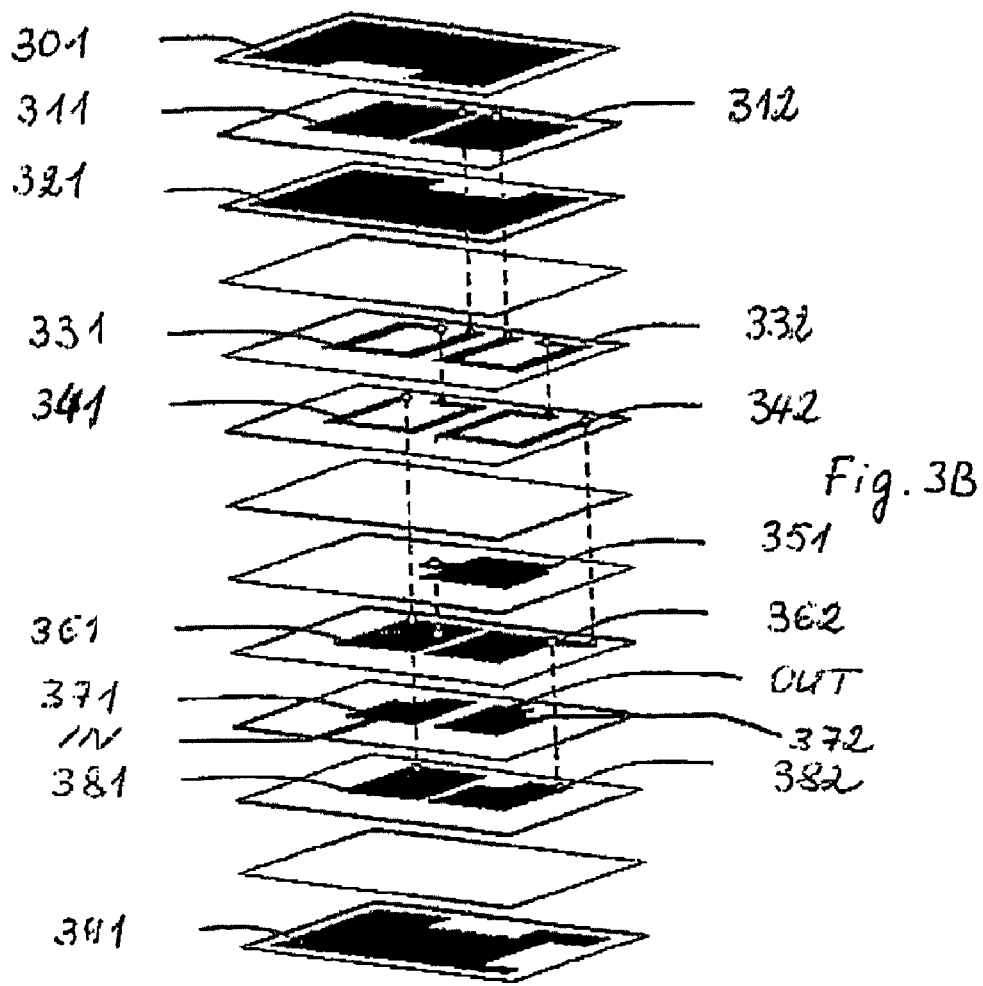
FIG. 3B, a multilayer component with the integrated high-pass filter according to FIG. 3A, which is arranged in the first signal path of the receive path.

FIG. 3B shows one possibility for realizing third filter F11, arranged in receive path RX1, in the multilayer substrate.

The substrate is preferably an LTCC substrate with ceramic layers, each arranged between metallization planes.

Capacitor C1 is a multilayer capacitor formed between conducting surface 371 and conductively connected conductive surfaces 361 and 381 arranged in different planes. Capacitor C3 is formed in the same manner between conductive surfaces 372, 362 and 382. Capacitor C2 is formed between conductive surfaces 351 and 362. Inductor L1 is realized by means of conductive traces 331 and 341, which are arranged one above the other. Inductor L2 is realized by means of conductive traces 332 and 342, which are arranged one above the other.

Capacitor C6 is formed between conductive surfaces 381 and 391, and capacitor C7 is formed between conductive surfaces 382 and 391.

Conductive surfaces 321 and 301 are conductively connected to one another. Capacitor C4 is formed between conductive surfaces 321, 301 and 311, and capacitor C5 is formed between conductive surfaces 321, 301 and 312.

The implementation of capacitors—in this case, capacitors C1, C3, C5 and C7—as multilayer capacitors has the advantage that only a comparatively small footprint is required to realize the specified capacitances.

The superimposed turns of the same inductor are capacitively coupled. It is important to keep the overlapping surface area constant despite the relative displacement of the metallization planes caused by the fabrication. In this regard, it is advantageous, in the case of turns 341, 331 and 332, 342 of the same inductor L1 and L2, respectively realized one above the other as conductive traces, to form the conductive traces in different planes with differing widths. For this reason it is also advantageous to construct the superimposed conductive surfaces that form a capacitor with surface areas differing from one another, so that their overlapping surface area remains constant despite the tolerance error.

The parts of inductors L1, L2 arranged in the same plane have sections parallel to one another and have a slight separation between one another, for example, less than twice the width of these sections.

Between the metallization planes, in which conductively functioning elements 331, 341, 332 and 342 are arranged, and the next metallization planes, which contain conductive surfaces 351, 321 with a relatively large surface area, two ceramic layers are arranged instead of only one. Thus, the undesired capacitive coupling of conductive traces 331, 341, 332 and 342 with those surfaces are reduced.

Two ceramic layers are also arranged between the metallization planes in which conductive surfaces are 381, 382 are arranged and a metallization plane in which surface 391 is arranged, in order to set a relatively small capacitance value of capacitors C6 and C7.

FIG. 4 shows one possibility for realizing third filter F12 arranged in transmit path TX1.

Capacitor C1 is formed here between surfaces 421, 423 and 431. Capacitor C3 is formed between surfaces 451, 461 and 471. Capacitor C2 is formed between surfaces 431, 441, 451 and 461. Surfaces 441 and 451 are arranged in different planes and are conductively connected to one another.

Inductor L1 is formed by conductive traces 422 and 411, and inductor L2 is formed by conductive traces 472 and 481. Capacitor C4 is formed between surfaces 432 and 442, and capacitor C5 is formed between surfaces 452 and 442. Surfaces 401, 442, and 491 are conductively connected to one another and to ground.

Capacitor C6 is formed between surfaces 421 and 401. Capacitor C7 is formed between surfaces 491 and 471.

Figure 5B:
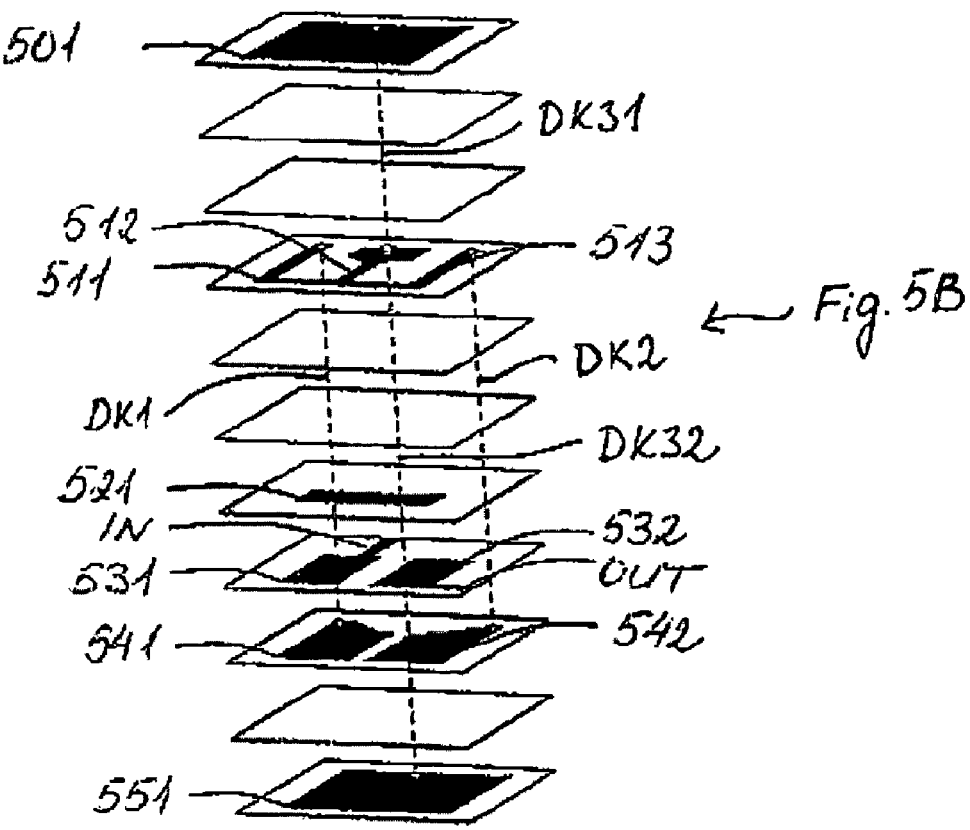
FIG. 5B, a multilayer component with the integrated bandpass filter according to FIG. 5A, which is arranged in a second signal branch of the receive path.
Figure 6:
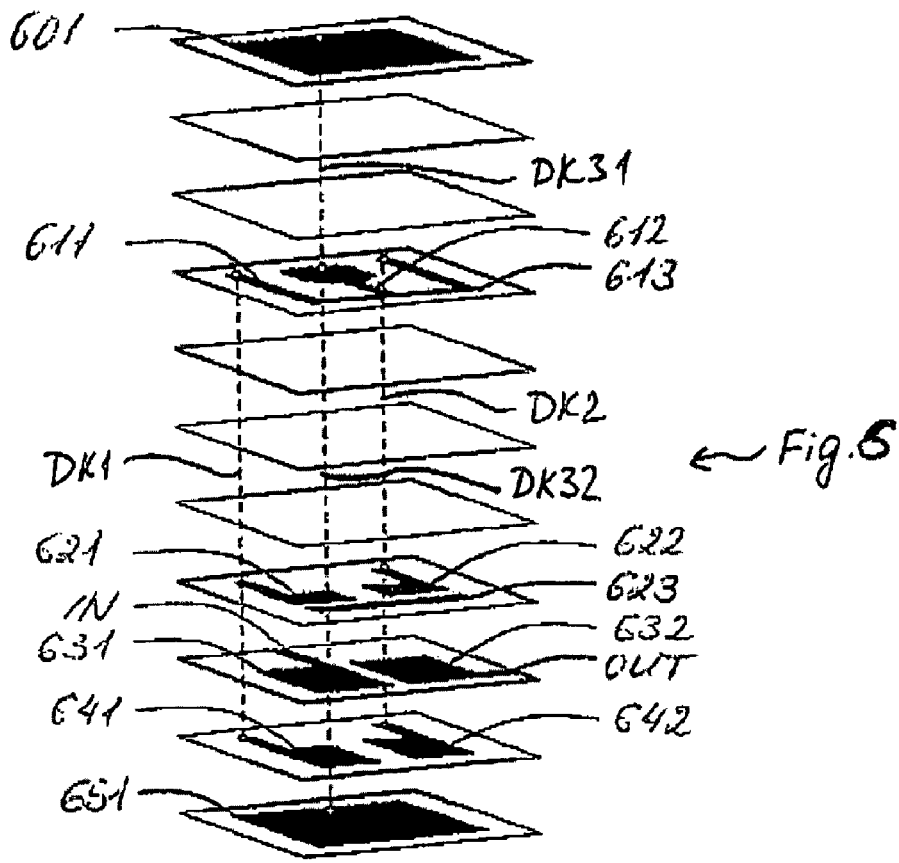
FIG. 6, a multilayer component with the integrated bandpass filter according to FIG. 5A, which is arranged in a second signal branch of the transmit path.
Figure 8:
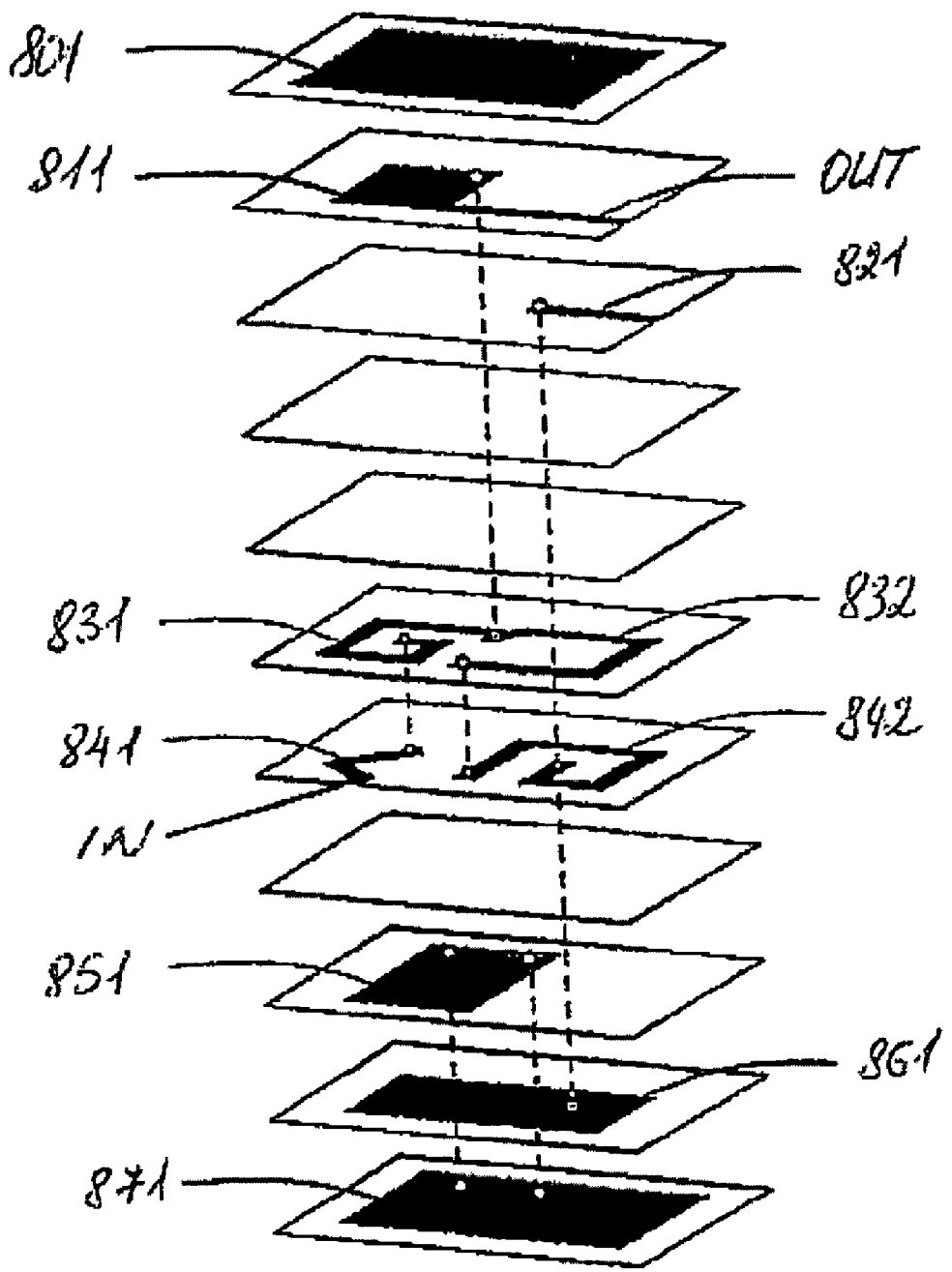
FIG. 8, a multilayer component with the integrated matching networks according to FIG. 7A, which are arranged in the signal branches of the transmit path.

Outer grounded surfaces 301 and 391 in FIG. 3B, 401 and 491 in FIGS. 4, 501 and 551 in FIG. 5B, 601 and 651 in FIGS. 6, 701 and 761 in FIG. 7B, and 801 and 871 in FIG. 8 serve to shield the metallization planes arranged therebetween.

FIG. 5B shows one possibility for realizing fourth filter F21 of receive path RX2 in the multilayer substrate.

Capacitor C1 is formed between superimposed surfaces 531 and 541, and capacitor C2 between surfaces 532 and 542. Capacitor C3 is realized as a series connection of two sub-capacitors. The first sub-capacitor is formed between surfaces 531 and 521, and the second between surfaces 521 and 532. Capacitor C4 is formed between superimposed surfaces 541 and 551, and capacitor C5 is formed between superimposed surfaces 542 and 551.

Inductor L1 is formed by plated through-hole DK1 and an L-shaped conductive trace 511. Inductor L2 is formed between plated through-hole DK2 and an L-shaped conductive trace 513. Inductor L3 is formed between a short conductive trace 512 and plated through-holes DK31 and DK32. This conductive trace is intentionally made wider at the point where it is connected to plated through-holes DK31 and DK32, in order to compensate for fabrication tolerances, specifically, the layer offset during the fabrication of the multilayer substrate.

FIG. 6 shows one possibility for realizing fourth filter F22 arranged in transmit path TX2 in the multilayer substrate.

Capacitor C1 is formed between superimposed surfaces, 621, 631 and 641. Surfaces 621 and 641 are conductively connected. Capacitor C2 is formed between surfaces 622, 632 and 642. Surfaces 622 and 642 are conductively connected.

Capacitor C3 is realized as a series connection of two sub-capacitors. The first sub-capacitor is formed between surfaces 631 and 623, and the second between surfaces 632 and 623. Capacitor C4 is formed between superimposed surfaces 641 and 651, and capacitor C5 is formed between superimposed surfaces 642 and 651.

Inductor L1 is formed by plated through-hole DK1 and an L-shaped conductive trace 611. The inductor L2 is formed by plated through-hole DK2 and an L-shaped conductive trace 613. Inductor L3 is formed by a short conductive trace 612 and plated through-holes DK31, DK32. This conductive trace is intentionally made wider at the point where it is connected to plated through-holes DK31 and DK32, in order to compensate for fabrication tolerances, specifically, the layer offset during the fabrication of the multilayer substrate.

FIG. 7B shows one possibility for realizing matching networks MA11 and MA21 arranged in receive path RX in the multilayer substrate.

Capacitor CIO is formed between conductive surfaces 701 and 711. Inductor L11 is formed by conductive traces 741 and 721. Inductor L21 is formed by conductive traces 731 and 722. Capacitor C21 is formed between surfaces 751 and 761. Capacitor C 11 is preferably small and therefore negligible. It can be formed, for instance, by parasitic capacitive couplings between the conductive surfaces shown in the figure.

FIG. 8 shows one possibility for realizing matching networks MA11 and MA21 (or MA12 and MA22) arranged in transmit path TX in the multilayer substrate.

Capacitor C20 is formed between conductive surfaces 801 and 811. Inductor L12 is formed by conductive traces 841 and 831. Inductor L22 is formed by conductive traces 832 and 842. Capacitor C22 is formed between surfaces 851, 861 and 871. Surfaces 871 and 851 are conductively connected. Capacitor C12 is negligible in this case.

Different areas of the same multilayer substrate are shown in FIGS. 3B, 4, 5B, 6, 7B and 8.

The specified multiband circuit is not limited to the examples shown in the figures, or to the number of elements shown therein. The multiband circuit can be designed for more than two frequency bands. An additional matching network, an impedance converter, or a filter such as a low-pass filter can be arranged in the common path TX, RX between antenna switch SW and the branch point of the signal path. Additional switches or duplexers can be provided in additional signal paths.

LIST OF REFERENCE SYMBOLS

1 Transfer function of filter F11 or F12
2 Transfer function of filter F21 or F22
1' Transfer function of first circuit MA11, F11 or MA12, F12
2' Transfer function of second circuit MA21, F21 or MA22, F22
301-871 Conductive traces
ANT1, ANT2 Antennas
Bal Balun
C1-C7, C11-C22 Capacitors
C10, C20 Capacitors
DK1, DK2, DK31, DK32 Plated through-holes
F11 Third filter arranged in first signal path RX10
F12 Third filter arranged in first signal path TX1
F21 Fourth filter arranged in second signal path RX2
F22 Fourth filter arranged in second signal path TX2
FB1 First frequency band
FB2 Second frequency band
FL Right flank of transfer function 1'
$f_{notch}$ Blocking frequency
IN Input
L1-L3, L11-L22 Inductors
LNA Low-noise amplifier
MA11 Matching network arranged in first signal branch RX10
MA12 Matching network arranged in first signal branch TX1
MA21 Matching network arranged in second signal branch RX2
MA22 Matching network arranged in second signal branch TX2
OUT Output
PA Power amplifier
RFIC Integrated circuit for processing WLAN data
RX Common path (receive path)
RX1 First signal branch (receive path)
RX2 Second signal branch (receive path)
SW Antenna switch
TX Common path (transmit path)
TX1 First signal branch (transmit path)
TX2 Second signal branch (transmit path)

The invention claimed is:

1. A multiband circuit comprising:
a signal path comprising a first signal branch and a second signal branch, the first and second signal branches being combined on an antenna side into a common path;
wherein the first signal branch comprises a first circuit that is transmissive in a first frequency band, the first circuit having a transfer function; and
the second signal branch comprises a second circuit that is transmissive in a second frequency band and having a blocking frequency ($f_{notch}$) the second circuit being configured to shunt radio frequency (RF) signals to ground at the blocking frequency ($f_{notch}$) and connect an antenna side input of the first signal branch at RF to ground;
wherein the second circuit is configured to make a flank in the transfer function of the first circuit steeper.

2. The multiband circuit of claim 1, wherein:
the first circuit comprises a first low-pass filter; and
the second circuit comprises a second low-pass filter, the second low-pass filter being conductively connected to the first low-pass filter and to the common path.

3. The multiband circuit of claim 2, wherein at least one of the first and second low-pass filters in the first signal branch or second signal branch is on the antenna side.

4. The multiband circuit of claim 2, further comprising:
a third filter downstream of the low-pass filter in the first signal branch; and a fourth filter downstream of the low-pass in the second signal branch.

5. The multiband circuit of claim 1, wherein the second frequency band is at least one octave above the first frequency band.

6. The multiband circuit of claim 5, wherein the blocking frequency ($f_{notch}$) is between the first and the second frequency bands.

7. The multiband circuit of claim 5, wherein the blocking frequency ($f_{notch}$) is below the first frequency band.

8. The multiband circuit of claim 5, wherein the blocking frequency ($f_{notch}$) is above the second frequency band.

9. The multiband circuit of claim 5, wherein:
the first circuit comprises a high-pass filter; and the blocking frequency ($f_{notch}$) is in the passband the high-pass filter.

10. The multiband circuit of claim 5, wherein:
the first circuit comprises a low-pass filter, and
the blocking frequency ($f_{notch}$) is in the passband of the low-pass filter.

11. The multiband circuit of claim 5, wherein:
the first circuit (comprises a bandpass filter, and the blocking frequency ($f_{notch}$) is above the passband of the bandpass filter.

12. The multiband circuit of claim 5, wherein:
the first circuit comprises a bandpass filter, and
the blocking frequency ($f_{notch}$) is i below the passband of the bandpass filter.

13. The multiband circuit of claim 1, wherein each of the first and second signal branches is a transmit path.

14. The multiband circuit of claim 1, wherein each of the first and second signal branches is a receive path.

15. The multiband circuit of claim 1, wherein the first circuit and the second circuit include concentrated LC elements.

16. The multiband circuit of claim 1, further comprising:
an additional signal path comprising an additional first signal branch and an additional second signal branch electrically connected on the antenna side into the common path.

17. A multiband circuit comprising:
a first signal branch transmissive in a first frequency band and a second signal branch transmissive in a second frequency band, the first and second signal branches being electrically connected on an antenna side into a common path; (RX, TX), a first low-pass filter in the first signal branch;

a second low-pass filter in the second signal branch, the second low-pass filter being conductively connected directly to the first low-pass filter and to the common path; and a second circuit configured to conduct RF signals to ground at a blocking frequency ($f_{notch}$) in the second signal branch.

18. An electronic component comprising:

a substrate; and a multiband circuit in the substrate, the multiband circuit comprising:

a signal path comprising a first signal branch comprising a first circuit that is transmissive in a first frequency band and a second signal branch comprising a second circuit that is transmissive in a second frequency band, the first and second signal branches being combined on an antenna side into a common path;

wherein the second circuit has a blocking frequency ($f_{notch}$) is configured to shunt radio frequency (RF) signals to ground at the blocking frequency ($f_{notch}$) and connects an antenna side input of first signal at RF to ground and the first circuit and the second circuits include concentrated LC elements;

wherein the second circuit is further configured to make a flank in the transfer function of the first circuit steeper.

19. The component of claim 18, wherein the substrate has ceramic layers.

20. A multiband circuit comprising:

a signal path comprising a first signal branch and a second signal branch, the first and second signal branches being combined on an antenna side into a common path;

wherein the first signal branch comprises a first circuit that is transmissive in a first frequency band, the first circuit having a transfer function; and the second signal branch comprises a second circuit that is transmissive in a second frequency band and having a blocking frequency ($f_{notch}$) the second circuit being configured to shunt radio frequency (RF) signals to ground at the blocking frequency ($f_{notch}$) and connects an antenna side input of the first signal branch at RF to ground;

wherein the second frequency band is at least one octave above the first frequency band.

* * * * *

UNITED STATES PATENT AND TRADEMARK OFFICE
CERTIFICATE OF CORRECTION

PATENT NO. : 8,081,047 B2
APPLICATION NO. : 12/088002
DATED : December 20, 2011
INVENTOR(S) : Sergiy Royak et al.

It is certified that error appears in the above-identified patent and that said Letters Patent is hereby corrected as shown below:

Claim 1, Column 10, Line 6 – delete "($f_{notch}$)" and insert -- ($f_{notch}$), --, therefor.

Claim 4, Column 10, Line 23 – after "low-pass" insert -- filter --.

Claim 11, Column 10, Line 43 – delete "(comprises" and insert -- comprises --, therefor.

Claim 12, Column 10, Line 48 – after "is" delete "i".

Claim 20, Column 12, Line 14 – delete "($f_{notch}$)" and insert -- ($f_{notch}$), --, therefor.

Signed and Sealed this
Twenty-first Day of February, 2012

David J. Kappos
*Director of the United States Patent and Trademark Office*